Figure 1:
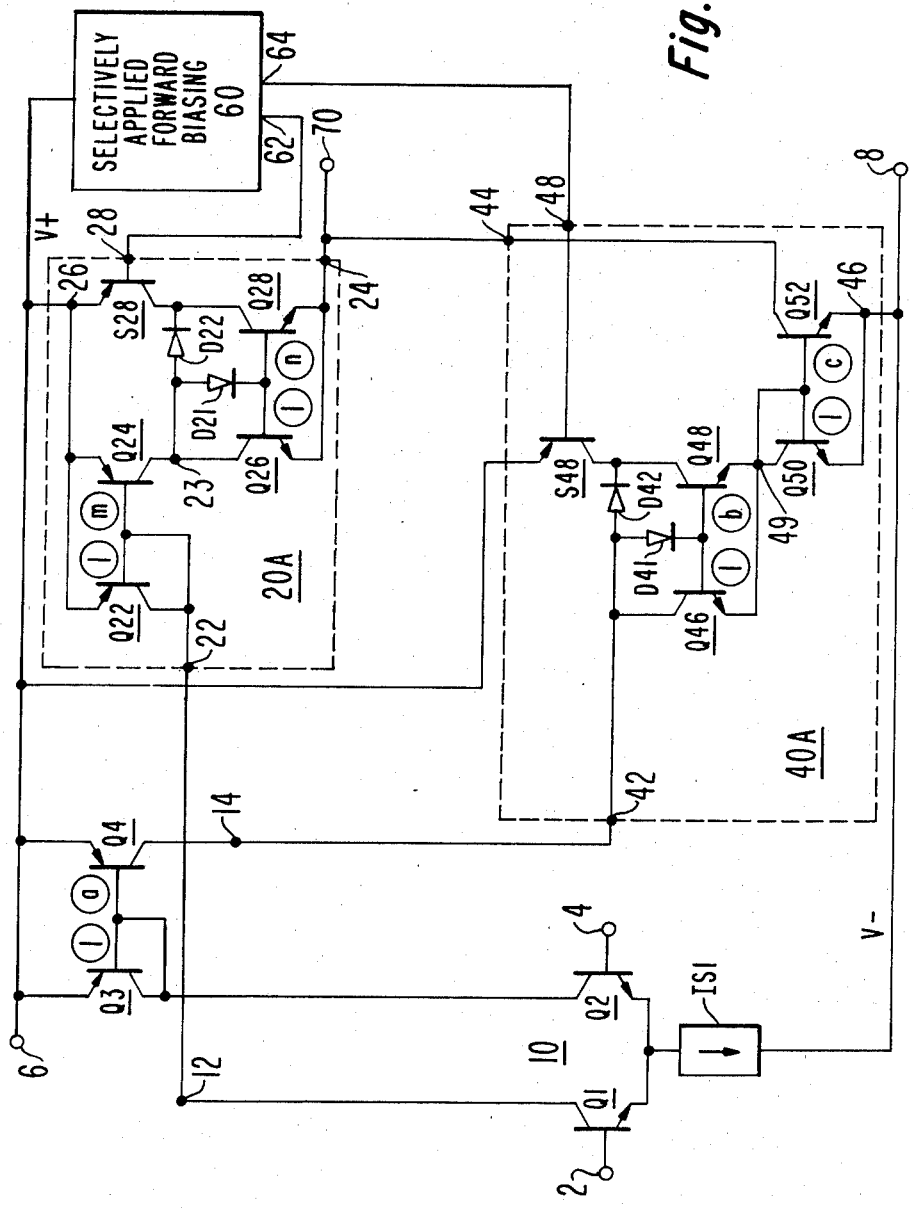

United States Patent [19]

Schade, Jr.

[11] 4,361,816
[45] Nov. 30, 1982

[54] CURRENT MIRROR AMPLIFIERS WITH PROGRAMMABLE GAIN

[75] Inventor: Otto H. Schade, Jr., North Caldwell, N.J.

[73] Assignee: RCA Corporation, New York, N.Y.

[21] Appl. No.: 164,139

[22] Filed: Jun. 30, 1980

[51] Int. Cl.³ .......................... H03F 3/45; H03G 3/30
[52] U.S. Cl. ................................... 330/288; 330/255; 330/257; 330/278
[58] Field of Search ............... 330/278, 288, 255, 257; 307/243, 242, 297; 323/315, 316, 317

[56] References Cited

U.S. PATENT DOCUMENTS

| | | | |
|---|---|---|---|
| 3,921,090 | 11/1975 | Wheatley, Jr. et al. | 330/30 D |
| 3,952,257 | 4/1976 | Schade, Jr. | 330/22 |
| 4,064,506 | 12/1977 | Cartwright, Jr. | 340/347 DA |
| 4,092,612 | 5/1978 | Schade, Jr. | 330/288 |
| 4,103,246 | 7/1978 | Limberg | 330/278 |
| 4,117,416 | 9/1978 | Schade, Jr. | 330/282 |
| 4,117,417 | 9/1978 | Ahmed | 330/288 |
| 4,119,924 | 10/1978 | Ahmed | 330/288 |
| 4,151,481 | 4/1979 | Funston et al. | 330/279 |
| 4,160,944 | 7/1979 | Ahmed | 323/4 |
| 4,177,392 | 12/1979 | Haferl | 307/254 |

*Primary Examiner*—James B. Mullins
*Attorney, Agent, or Firm*—Eugene M. Whitacre; Paul J. Rasmussen; Clement A. Berard, Jr.

[57] ABSTRACT

A current mirror amplifier includes first and second transistors connected together at their common electrodes, the first transistor being connected for receiving input signal current at its output electrode, and the control electrodes of the transistors being connected for conditioning the second transistor for conducting a current responsive to the input signal current. Switch means, responsive to a control signal, selectively connects the output electrode of the second transistor to a supply terminal so the current gain between the input signal current and the current in the connection of their common electrodes switches responsive to the control signal.

27 Claims, 6 Drawing Figures

CURRENT MIRROR AMPLIFIERS WITH PROGRAMMABLE GAIN

The present invention relates to current mirror amplifiers exhibiting programmable current gain assuming one of a plurality of predetermined values dependent upon a control signal.

Current mirror amplifiers (CMAs) are widely used current amplifiers of a sort that provide predetermined well-defined current gains, dependent primarily upon the relative physical sizes of the transistors they employ and substantially independent of the individual current gains of those transistors. Often it is desired to have a programmable-gain current mirror amplifier which selectively exhibits any of a plurality of values of current gain. Such programmable-gain CMAs are shown in U.S. Pat. No. 4,064,506 issued to J. M. Cartwright, Jr. on Dec. 20, 1977 entitled "Current Mirror Amplifiers With Programmable Current Gains" and in U.S. Pat. No. 4,117,416 issued to O. H. Schade, Jr. on Sept. 26, 1978 and entitled "Current Mirror Amplifiers With Programmable Current Gains" which use transmission gates for programming purposes. Cartwright's transmission gates connect between an input terminal and the respective gates of field-effect transistors (FET) forming the input or master transistors. Schade's transmission gates connect between an input terminal and the respective bases of input or master bipolar transistors and of output or slave bipolar transistors.

The transmission gates required for these programmable-gain CMAs will, in their simplest form, include a field-effect transistor (FET) which is floating with respect to the operating potentials being switched in the programmable-gain CMA, which is difficult to provide in some circumstances—e.g. when FETs are unavailable or when large control signal voltage swings are unavailable for controlling the gate potentials of the transmission-gate FETs. Those prior are programmable-gain CMAs also include a polarity inversion between their input and output terminals which is not needed in some applications and may introduce undesired circuit complexity to eliminate.

It would be desirable to obtain programmable current gain CMAs which require minimal increased complexity, do not substantially degrade the accuracy of the current gain ratio, and which employ switches which do not float with respect to the operating or reference potentials.

The present invention comprises a source of input signal current connected between a first supply voltage terminal and an input signal current terminal, and load means connected between an output signal current terminal and a second supply voltage terminal. A plurality of transistors have their respective common electrodes connected to the output signal current terminal and a first of those transistors has its output electrode connected to the input signal current terminal for receiving the input signal current. A direct-coupled feedback connection from the output electrode of the first transistor to the respective input electrodes of the plurality of transistors establishes a potential thereat to condition them for conduction. Respective switch means selectively connect the output electrode of an associated other one of the plurality of transistors to the first supply voltage terminal to condition the associated transistor to conduct a current to augment the conduction of the first transistor and thus increment the current gain between the input signal current and the output signal current terminals.

In the drawings:

FIG. 1 is a schematic diagram of an operational amplifier in which programmable CMAs according to the present invention are employed; and FIGS. 2, 3, 4, 5, and 6 are schematic diagrams of programmable CMAs including the present invention.

In the FIG. 1 operational amplifier with digitally programmable gain, differential amplifier 10 supplies first and second drive currents from output connections 12 and 14, responsive to the difference between input signals received at differential-input connections 2 and 4.

Programmable current mirror amplifier 20A supplies current from supply terminal 6 to output terminal 70 via supply connection 26 and output connection 24, responsive to drive current received at its input connection 22. The gain -G of current amplifier 20A is switched responsive to control signals received at control connection 28.

Programmable current mirror amplifier 40A conducts current between output terminal 70 and supply terminal 8 via output connection 44 and supply connection 46 responsive to drive current received at its input connection 42. The gain -H of current amplifier 40A is switched responsive to control signals received at control input 48.

Control signals to current amplifiers 20A and 40A are supplied from control output connections 62 and 64, respectively, of selectively applied forward biasing source 60. Usually, the control input signals are applied so as to make G and H equal each other as they are programmed between one of their respective values and another; in this way, the FIG. 1 amplifier is made to exhibit common-mode signal rejection for each value of G and H.

More specifically, transistors Q1 and Q2 in long-tailed-pair connection serve as differential-input amplifier 10, responding to input signals received at terminals 2 and 4 and applied between their respective bases, to provide drive currents at their respective collectors. Emitter bias current for Q1 and Q2 is supplied by current source IS1 returned to a relatively negative supply voltage V- rail connecting to supply terminal 8. Drive current from the collector of Q1 couples directly to output connection 12 of amplifier 10 while a drive a current a times the collector current of Q2 couples to output connection 14 from the collector of output transistor Q4 connected in CMA connection with transistor Q3.

Programmable current mirror amplifier 20A receives drive current at the input connection 22 of a current mirror amplifier (CMA) formed by input transistor Q22 and output transistor Q24. The current gain of this CMA as between its input connection 22 and its output connection at the collector of Q24 is $-m$, as determined by the ratio of the emitter areas of Q24 and Q22, which areas are represented by the encircled characters proximate to the transistors in the drawings. Collector current from Q24 is applied to input connection 23 of a further CMA including input transistor Q26 and output transistor Q28. The output connection of this further CMA is selectively connected via switch S28 to a relatively positive operating voltage V+ rail 26 connecting to terminal 6, and the common connection 24 of this further CMA is to output terminal 70.

Assuming switch S28 to be nonconductive, collector current from Q24 flows unchanged to output connection 24 through the collector-emitter conduction path of Q26, diode D21 and the base-emitter paths of Q26 and Q28, and diode D22 and the collector-emitter conduction path of Q28. It is unimportant by which path that current flows, the important feature being that the current gain between the collector of Q24 and output connection 24 is unity, when switch S28 is nonconductive. This has to be so in order to satisfy Kirchoff's Law of Currents.

On the other hand, when forward bias selectively applied by source 60 renders switch S28 (shown by way of example as a PNP bipolar transistor) conductive, diode D22 is reversed-biased and transistors Q26 and Q28 function as a CMA, the collector current in Q28 being n times the collector current in Q26. Those collector currents are summed at output connection 24 together with the base currents supporting them. These base currents are generally negligibly small compared to the collector currents, so that the current at output connection 24 is $(1+n)$ times the current applied to input connection 23.

Current amplifier 20A exhibits gain factor $G=m$ when switch S28 is nonconductive, and exhibits gain factor $G=m(1+n)$ when S28 is rendered conductive responsive to a control signal.

Programmable current mirror amplifier 40A includes elements Q46, Q48, D41, D42, and S48 corresponding respectively to elements Q26, Q28, D21, D22, and S28 of programmable current mirror amplifier 20A and includes a further CMA with current gain substantially equal to $-c$ in cascade thereafter. This further CMA includes input transistor Q50 and output transistor Q52 which conducts current between output terminal 70 and supply terminal 8. The current gain between node 42 and terminal 70 is switched between the values $H=c$ and $H=c(1+b)$ responsive to forward bias selectively applied to switch S48 at its base from source 60. In most cases the emitter areas of corresponding transistors in current amplifiers 20A and 40A and Q4 would be made equal so that the respective current gains between connections 12 and 14 and output terminal 70 are equal. E.g., with $m=a=1$, $n=b=9$, and $c=1$, the absolute values of the current gains of current amplifiers 20A and 40A are switchable between the values 1 and 10 responsive to control signals rendering switches S28 and S48 selectively conductive.

The similarity between the configuration of programmable current mirror amplifiers 20A and 40A desirably allows closely matched transistor chracteristics therebetween when the amplifier is constructed as a monolithic integrated circuit. For example, transistors Q22, Q24, Q3, and Q4 might be formed as lateral PNP bipolar transistors which tend to have relatively low common-emitter forward current gain which tends to introduce base-current errors when those transistors are used in a CMA. Due to structural similarity and closely matched areas between transistors in the current paths from 12 to 70 and from 14 to 70, the ratio G/H is insensitive to the actual values of forward current gain of individual transistors.

Switches S28 and S48 are PNP transistors arranged for selectively connecting the collectors of Q28 and Q48, respectively, to supply voltage V+ responsive to forward bias selectively applied at connections 28 and 48 from source 60. S28 and S48 are rendered conductive when the potentials at connections 28 and 48 are pulled negative by more than a base-emitter potential $V_{BE}$ with respect to the supply rail V+ and are rendered nonconductive when those potentials approach supply voltage V+. Programmable current mirror amplifiers of the type just described desirably supply output currents to amplifier terminal 70 that are determined by the emitter areas of the transistors of the CMA. No error is introduced by the base currents of the switch transistors S28 or S48, be they PNP or NPN, as the degree to which they conduct is conditioned by the collector current demands of Q28 and Q48 respectively.

Transconductance is usually programmed responsive to digital control signals of complementary sense so that S28 and S48 are rendered selectively conductive together and the programmed values G and H of current amplifiers 20A and amplifier 40A, respectively, increase and decrease together. Predetermined programmed values of G and H are determined by the selected emitter areas m, n, a, b, and c. When S28 and S48 are nonconductive, the OTA is in its lower gain state with $G=m$ and $aH=ac$. When S28 and S48 are conductive, the OTA is in its increased gain state with $G=m(1+n)$ and $aH=ac(b+1)$. Usually, one desires to select the respective emitter areas to make G and aH substantially equal in each gain state. For example, by selecting $m=a=4$, $n=b=9$ and $c=1$, one establishes the programmed values of both G and aH to be 4 in the lower gain state and 40 in the increased gain state, i.e., in the convenient ratio of 1:10.

When the circuit of FIG. 1 is constructed in certain monolithic integrated circuit (IC) technologies, one must consider the effects of parasitic elements formed between the desired elements and the substrate. Such considerations are, of course, unnecessary when the circuit is constructed in discrete form or in an inherently isolating technology such as silicon-on-sapphire. In current amplifier 20A, a parasitic PNP transistor (not shown) could be formed having its emitter connected to Q28 base, having its base connected to Q28 collector and having its collector connected to substrate which connects to terminal 8. When S28 is nonconductive, the Q28 collector potential can fall below that at its base tending to forward bias the base-emitter junction of the parasitic PNP transistor causing it to conduct current from the base of Q28 to the substrate. That causes the current gain between Q24 collector and output connection 24 to undesirably depart from unity.

Diodes D21 and D22 prevent the potential at Q28 collector from approaching its emitter potential more closely than does its base potential. While D21 is normally forward biased, D22 is poled so that it becomes conductive when the Q28 collector potential falls towards that at output connection 24. D22 thereby prevents the parasitic PNP transistor from conducting when S28 is nonconductive to maintain substantially unity current gain. When S28 conducts, connecting Q28 collector to supply voltage V+ at connection 26, D22 is reverse biased so substantially no current flows therethrough and the current gain of Q26-Q28 is thereby substantially $(1+n)$.

Diodes D41 and D42 perform a similar function with respect to Q48 and its associated parasitic PNP transistor.

Programmable CMAs 20A and 40A of FIG. 1 are different embodiments of the present invention; each supplying an output current in inverted polarity sense with respect to its input current. Both CMAs retain the basic simplicity of the Q26-Q28 CMA or the Q46-Q48

CMA because only a single element, switch S28 or S48, is required to implement the programmable gain feature. Furthermore, switches S28 and S48 do not float but are each connected at one of its electrodes to a supply voltage V+ permitting the use of a variety of semiconductor elements therefor. For example, S28 could be a bipolar transistor of either PNP or NPN type, or a FET of either N-channel or P-channel type. The characteristics of the switch, e.g., the saturation voltage drop $V_{sat}$ or current gain $h_{fe}$ in the case of a bipolar transistor, or the channel resistance $r_{ds}$ in the case of a FET, do not introduce error into the current gain ratio of the CMA.

Figure 2:
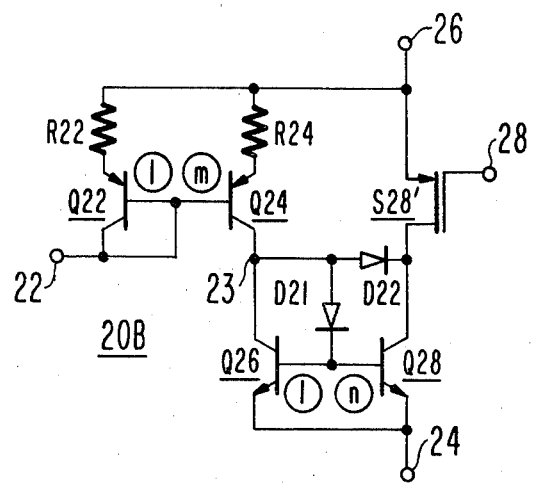

Programmable current mirror amplifier 20B of FIG. 2 differs from CMA 20A of FIG. 1 in that: emitter-resistors R22 and R24 are included to linearize the Q22-Q24 CMA; and P-channel FET S28 selectively connects the collector of Q28 to relatively positive supply voltage V+. Its operation is analagous to CMA 20A.

Figure 3:
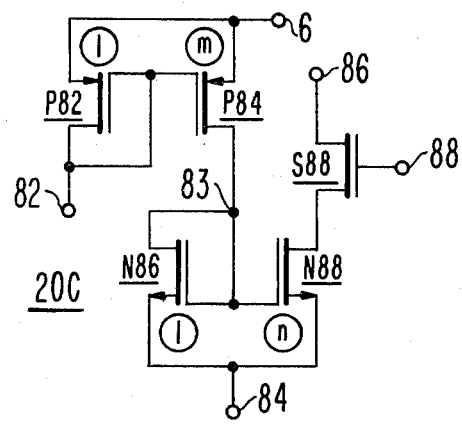

FIG. 3 shows another programmable current mirror amplifier 20C suitable for replacing those shown above but employing FETs. In terms of amplifier 20A, P82 corresponds to Q22, P84 corresponds to Q24, and so forth. FIG. 3 also illustrates that any of the switched-gain current amplifiers described herein may employ either bipolar or field-effect transistors. Output FET P84 provides output current m times the input current applied to input FET P82. Similarly, FET N88 conducts a current n times that applied to FET N86 at its input circuit at node 83 when switch FET S88 connects the drain of N88 to an operating voltage at terminal 86.

Figure 4:
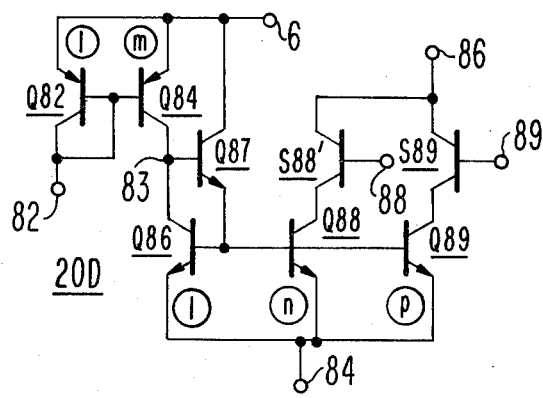

FIG. 4 shows a further programmable CMA 20D suitable for replacing any of the switched-gain programmable current mirror amplifiers shown in FIGS. 1-3. Current supplied to intermediate node 83 from output transistor Q84 is m times the input current received at connection 82 by input transistor Q82. Q86 and Q88 form a CMA with an input connection at node 83 similar to that described above for switched-gain current amplifier 20A but differing therefrom in that direct-coupled feedback from the collector of Q86 to the bases of Q86 and Q88 is provided by emitter-follower connected transistor Q87 is place of a direct connection. Q87 supplies base currents to Q86, Q88 and Q89 to substantially reduce errors caused by their base-currents. The collector of Q88 is selectively connected by switch S88, which can be either an NPN or a PNP transistor, to a relatively positive potential at connection 86 responsive to a control potential or current supplied to connection 88. A further output circuit is formed by Q89, the collector of which is selectively connected to supply voltage connection 86 by switch S89 responsive to control potential or current received at connection 89. CMA 20D thereby exhibits a plurality of current gains G responsive to a plurality of control signals.

When CMA 20D is used in position 20A in FIG. 1, supply connection 86 connects to supply terminal 6 and output signal connection 84 connects to output terminal 70. When neither S88 nor S89 is conductive, current gain G=m; when S88 alone is conductive, G=m(1+n); when S89 alone is conductive, current gain G=m(1+p); and when both S88 and S89 are conductive, G=m(1+n+p).

On the other hand, if CMA 20D were to be used in position 40A of FIG. 1, then output connection 86 would connect to output terminal 70 and common connection 84 would connect to relatively negative potential V− at supply terminal 8. When neither S88 nor S89 is conductive, current gain H=0, when S88 alone is conductive, H=mn; when S89 alone is conductive, H=mp; and when both S88 and S89 are conductive, H=m(n+p).

If the current amplifier of FIG. 4 is constructed in a monolithic IC technology where parasitic PNP transistors occur, the base-emitter junction of Q87 serves the function of diode D21 above and further diodes (not shown) would have their respective anodes connected to the base of Q87 and would have their respective cathodes individually connected to the respective collectors of Q88, Q89 and so forth to serve the function of D22 above.

A desirable feature of the switched-gain current amplifiers of FIGS. 1-4 is that their switches do not "float" but are directly referenced to a supply rail, i.e. potential V+ at supply terminal 6, so that bipolar switch transistors of either NPN or PNP conductivity may be employed.

Figure 5:
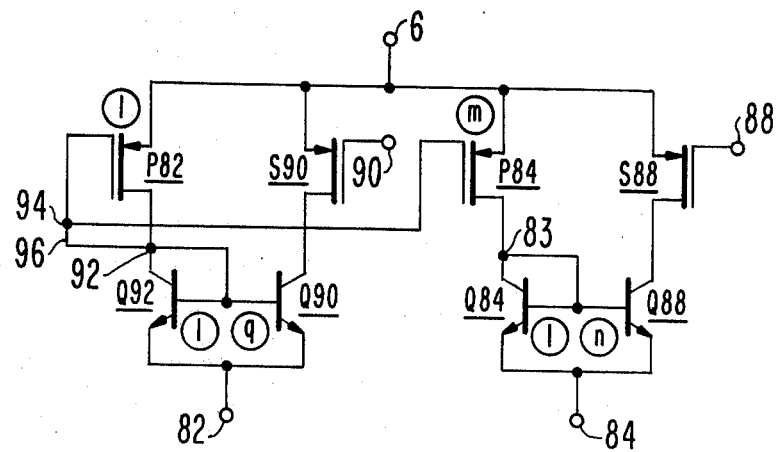

In the programmable current mirror amplifier of FIG. 5, the current gain G between input signal current terminal 82 and output signal current terminal 84 may be programmed to include a range of values both greater than and less than unity. FETs P82 and P84 form a CMA similar to that formed by like designated FETs in FIG. 3, and supplying output current at output connection 83 m times the input current received at input connection 92 at the drain of P82. The gates of P82 and P84 connect together at node 94 and connect by direct-coupled feedback connection 96 to input connection 92.

The programmable CMA formed by transistors Q84 and Q88 responds to switch transistor S88 corresponding to Q26, Q28 and S28', respectively. Its current gain between node 83 and terminal 84 is unity when S88 is non-conductive and is (1+n) when S88 is rendered conductive responsive to a control signal applied at connection 88.

The programmable CMA formed by Q92, Q90 and S90 differs from that formed by Q84, Q88 and S88 in that input current is withdrawn from the interconnection of the emitters of Q92 and Q90 at terminal 82 and output current is supplied at node 92. When S90 is non-conductive, Q90 conducts no collector current so that the current withdrawn from terminal 82 flows entirely to node 92, the current gain therebetween being unity to satisfy Kirchoff's Current Law. Q92 is rendered conductive by the direct-coupled feedback connection between its collector and base. Control signals applied to control connection 90 render switch S90 selectively conductive to condition Q90 for conduction by the selective connection of its collector to supply voltage at terminal 6. Then, Q92 conducts to node 92 the portion 1/(1+q) of the input signal current withdrawn from terminal 82.

Transistors Q92, Q90 and S90 thus serve as a programmable current splitting circuit providing a predetermined portion of the input current applied at terminal 82 to a load connected between node 92 and supply terminal 6.

The current gain of the FIG. 5 CMA is programmable as follows: when both S90 and S88 are nonconductive, G=m; when S90 alone is conductive, G=m/(1+q); when S88 alone is conductive, G=m(1+n); and when both S90 and S88 are conductive, G=m(1+n)/(1+q). For example, if m=n=q=1, then the current gain G for the above four programming conditions is 1, ½, 2, 1, respectively.

Figure 6:
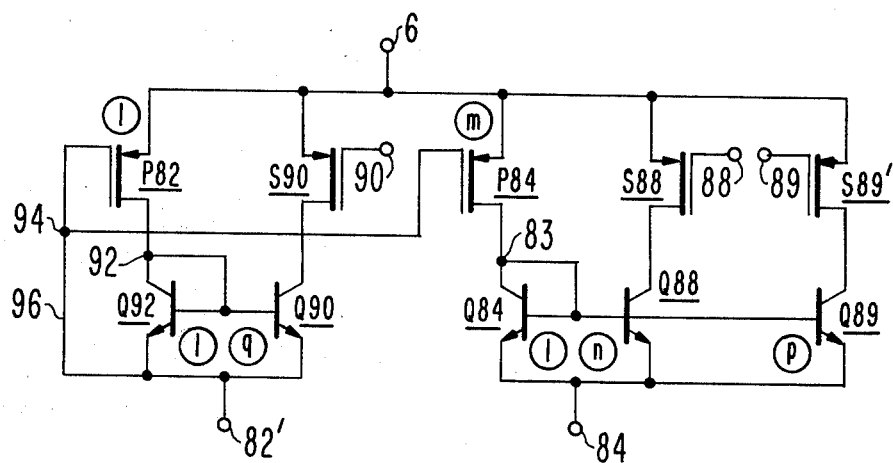

The programmable CMA of FIG. 6 differs from that of FIG. 5 in that the direct-coupled potential feedback to the gates of P82 and P84 at node 94 by connection 96 is offset from the potential at node 92 by the base-emitter forward conduction potential of Q92. A further difference is that a further output circuit comprising Q89 and S89' connects to the Q84, Q88 CMA in similar manner and with similar result to that described above for the circuit of FIG. 4. Current gain G for the CMA of FIG. 6 is, for example, G=m when all of switches S88, S89' and S90 are nonconductive, and G=m(1+n+p)/(1+q) when those switches are all conductive; gain values for others of the plurality of programmable gain states may be determined in similar manner to that described hereinabove for other programmable CMA embodiments including the present invention.

In the claims, a bipolar base or FET gate is referred to as an input electrode, a bipolar emitter or FET source is referred to as a common electrode, and a bipolar collector or FET drain is referred to as an output electrode. Where either connection or conductivity transistor could be used, for example, as in switches S28, S48, or S88, the transistors are designated as having merely first and second electrodes referring to either their output or common electrodes, and an input electrode. NPN bipolar transistors and N-channel FETs are of like conductivity type and are complementary to that of PNP bipolar transistors and P-channel FETs.

One skilled in the art of design when armed with the teachings of this disclosure would be able to discern embodiments according to the present invention in addition to those described herein. For example, a CMA in the form of CMA 20A but employing complementary conductivity transistors could be used in the location of CMS 40A, referenced to supply terminal 8.

Any of the switched-gain CMAs can be provided with additional output circuits in any desired number in the manner shown in FIG. 4 by the addition of Q89, S89, and so forth. One such embodiment that is particularly useful includes a plurality of output transistors having respective emitter areas in the ratio of 1:1:3:7:15 and so on so that the plurality of values of current gain are in the binary-weighted ratio 1:2:4:8 and so on. Accordingly, the invention is limited only by the appended claims which should be broadly construed to include the full scope and spirit of the invention.

What is claimed is:

1. Programmable current amplifying circuitry comprising:
   first and second supply voltage terminals;
   an input signal current terminal;
   an output signal current terminal;
   a source of input signal current connected between said first supply voltage terminal and said input signal current terminal;
   load means connected between said output signal current terminal and said second supply voltage terminal;
   a plurality of transistors of like conductivity type having respective input and output electrodes, and having respective common electrodes connected to said output signal current terminal, the output electrode of a first one of said plurality of transistors connecting to said input signal current terminal for receiving said input signal current;
   direct-coupled feedback means having an input connection at the output electrode of the first one of said transistors and having an output connection for establishing a potential at the respective input electrodes of said plurality of transistors to condition them for conduction; and
   respective switch means selectively connecting the output electrode of an associated other one of said plurality of transistors to said first supply voltage terminal, for conditioning its associated transistor to conduct to augment the conduction of said first one of said transistors and thus increment the current gain between said input signal current and said output signal current terminals.

2. The amplifying circuitry of claim 1 wherein said load means includes:
   current mirror amplifying means having an input connection to which said output signal current terminal connects, having a common connection connected to said second supply voltage terminal, and having an output connection; and
   further load means connected between said output connection and said first supply voltage terminal.

3. The amplifying circuitry of claim 2 wherein said current mirror amplifying means includes:
   first and second further transistors of like conductivity type to that of the transistors called for in claim 1, having respective input, output and common electrodes, their common electrodes connecting to said common connection, the output electrode of said first further transistor connecting to said input connection, the output electrode of said second further transistor connecting to said output connection; and
   direct-coupled feedback means having an input connection at the input connection of said current mirror amplifying means, and having an output connection to establish a potential at the respective input electrodes of said first and second further transistors to condition them for conduction.

4. The amplifying circuitry of claim 1, 2 or 3 wherein each said switch means includes:
   a switch transistor having first and second electrodes and a principal-conduction path therebetween, and having a control electrode to which its principal conduction path is responsive, the principal-conduction path of said switch transistor connecting the output electrode of its associated transistor to said first supply voltage terminal; and
   means selectively applying a control signal to the control electrode of said switch transistor for rendering its principal-conduction path selectively conductive.

5. The amplifying circuitry of claim 4 wherein said plurality of transistors are of bipolar type and said switch transistor is of field-effect type.

6. The amplifying circuitry of claim 1, 2 or 3 further including:
   means connected between the respective input and output electrodes of said transistors associated with said switch means, for maintaining the potential at the output electrode of each said associated transistor at least as remote from the potential at its common electrode as is the potential at its input electrode, when its output electrode is not connected to said first supply voltage terminal by said switch means.

7. The amplifying circuitry of claim 6 wherein said means connected between the respective input and output electrodes includes:
- a plurality of diode means of same number as said plurality of transistors, each having first and second electrodes, said first electrodes being connected together;
- a first of said plurality of diode means having its second electrode connected to the input electrode of the first one of said plurality of transistors;
- each of the others of said plurality of diode means having its second electrode connected to the output electrode of an associated other of said transistors, and being poled to be reverse biased when the output electrode to which it connects is selectively connected to said first supply voltage terminal by said switch means.

8. Programmable current mirror amplifying circuitry comprising:
- first and second supply voltage terminals;
- an input signal current terminal;
- an output signal current terminal;
- an intermediate node;
- a source of input signal current connected between said first supply voltage terminal and said input signal current terminal;
- load means connected between said output signal current terminal and said first supply voltage terminal;
- current mirror amplifying means having an input connection connected to said input signal current terminal for receiving said input signal current, having a common connection connected to said second supply voltage terminal, and having an output connection connected to said intermediate node;
- a plurality of transistors of like conductivity type having respective input and output electrodes, and having respective common electrodes connected to said output signal current terminal, the output electrode of a first one of said transistors connecting to said intermediate node;
- direct-coupled feedback means having an input connection at the output electrode of the first one of said transistors and having an output connection for establishing a potential at the respective input electrodes of said plurality of transistors to condition them for conduction; and
- respective switch means selectively connecting the output electrode of an associated other one of said plurality of transistors to said second supply voltage terminal for conditioning its associated transistor to augment the conduction of said first transistors and thus increment the current gain between said input signal current and said output signal current terminals.

9. The amplifier circuitry of claim 8 wherein said current mirror amplifying means includes:
- first and second further transistors of complementary conductivity type to that of the transistors called for in claim 8, having respective input, output and common electrodes, their common electrodes connecting to said common connection, the output electrode of said first further transistor connecting to said input connection, the output electrode of said second further transistor connecting to said output connection; and
- direct-coupled feedback means having an input connection at the input connection of said current mirror amplifying means and having an output connection to establish a potential at the respective input electrodes of said first and second further transistors to condition them for conduction.

10. The amplifier circuitry of claim 8 or 9 wherein each said switch means includes:
- a switch transistor having first and second electrodes and a principal-conduction path therebetween, and having a control electrode to which its principal-conduction path is responsive, the principal-conduction path of said switch transistor connecting the output electrode of its associated transistor to said second supply voltage terminal; and
- means selectively applying a control signal to the control electrode of said switch transistor for rendering its principal-conduction path selectively conductive.

11. Programmable current mirror amplifying circuitry comprising:
- first and second supply voltage terminals;
- an input signal current terminal;
- an output signal current terminal;
- an intermediate node;
- a source of input signal current connected between said first supply voltage terminal and said input signal current terminal;
- load means connected between said output signal current terminal and said first supply voltage terminal;
- a plurality of transistors of like conductivity type having respective input and output electrodes, and having respective common electrodes connected to said intermediate node, the output electrode of a first one of said transistors connecting to said input signal current terminal for receiving said input signal current;
- direct-coupled feedback means having an input connection at the output electrode of the first one of said transistors and having an output connection for establishing a potential at the respective input electrodes of said plurality of transistors to condition them for conduction;
- current mirror amplifying means having an input connection to which said intermediate node connects, having a common connection connected to said second supply voltage terminal, and having an output connection connected to said output signal current terminal; and
- respective switch means selectively connecting the output electrode of an associated other one of said plurality of transistors to said first supply voltage terminal for conditioning its associated transistor to augment the conduction of said first transistor and thus increment the current gain between said input signal current and said output signal current terminals.

12. The amplifying circuitry of claim 11 wherein said current mirror amplifying means includes:
- first and second further transistors of like conductivity type to that of the transistors called for in claim 11, having respective input, output and common electrodes, their common electrodes connecting to said common connection, the output electrode of said first further transistor connecting to said input connection, the output electrode of said second further transistor connecting to said output connection; and direct-coupled feedback means having an input connection at the input connection of said current mirror amplifying means and having an output connection to establish a potential at the respective input electrodes of said first and second further transistors to condition them for conduction.

13. The amplifying circuitry of claim 11 or 12 wherein each said switch means includes:
a switch transistor having first and second electrodes and a principal-conduction path therebetween, and having a control electrode to which its principal-conduction path is responsive, the principal-conduction path of said switch transistor connecting the output electrode of its associated transistor to said first supply voltage terminal; and
means selectively applying a control signal to the control electrode of said switch transistor for rendering its principal-conduction path selectively conductive.

14. Programmable current splitting circuitry comprising:
first and second supply voltage terminals;
an input signal current terminal;
an output signal current terminal;
a source of input signal current connected between said first supply voltage terminal and said input signal current terminal;
load means connected between said output signal current terminal and said second supply voltage terminal;
a plurality of transistors of like conductivity type, having respective input and output electrodes, and having respective common electrodes to which said input signal current terminal connects, the output electrode of a first one of said plurality of transistors connecting to said output signal current terminal;
direct-coupled feedback means having an input connection at the output electrode of the first one of said plurality of transistors, and having an output connection for establishing a potential at the respective input electrodes of said plurality of transistors to condition at least said first one thereof to conduct at least a portion of said input signal current; and
respective switch means selectively connecting the output electrode of an associated other one of said plurality of transistors to said second supply voltage terminal for conditioning its associated transistor to conduct to decrease the conduction of said first one of said plurality of transistors and thus decrement the current gain between said input signal current and said output signal current terminals.

15. The circuitry of claim 14 wherein said load means includes:
current mirror amplifying means having an input connection to which said output signal current terminal connects, having a common connection connected to said second supply voltage terminal, and having an output connection; and
further load means connected between said output connection and said first supply voltage terminal.

16. The circuitry of claim 15 wherein said current mirror amplifying means includes:
first and second further transistors of conductivity type complementary to that of the transistors called for in claim 14, having respective input, output, and common electrodes, their common electrodes connecting to said common connection, the output electrode of said first further transistor connecting to said input connection, the output electrode of said second further transistor connecting to said output connection; and direct-coupled feedback means having an input connection at the input connection of said current mirror amplifying means and having an output connection to establish a potential at the respective input electrodes of said first and second further transistors to condition them for conduction.

17. The amplifying circuitry of claim 14, 15, or 16 wherein each said switch means includes:
a switch transistor having first and second electrodes and a principal-conduction path therebetween, and having a control electrode to which its principal-conduction path is responsive, the principal-conduction path of said switch transistor connecting the output electrode of its associated transistor to said second supply voltage terminal; and
means selectively applying a control signal to the control electrode of said switch transistor for rendering its principal-conduction path selectively conductive.

18. Programmable current mirror amplifying circuitry comprising:
first and second supply voltage terminals;
an input signal current terminal;
an output signal current terminal;
a source of input signal current connected between said first supply voltage terminal and said input signal current terminal;
load means connected between said output signal current terminal and said first supply voltage terminal;
current mirror amplifying means having input and output connections, and having a common connection to said second supply voltage terminal;
a plurality of transistors of like conductivity type, having respective input and output electrodes, and having respective common electrodes to which said input signal current terminal connects, the output electrode of a first one of said plurality of transistors connecting to the input connection of said current mirror amplifying means;
direct-coupled feedback means having an input connection at the output electrode of the first one of said plurality of transistors, and having an output connection for establishing a potential at the respective input electrodes of said plurality of transistors to condition at least said first one thereof to conduct at least a portion of said input signal current;
a plurality of further transistors of like conductivity type to that of said plurality of transistors, having respective input and output electrodes, and having respective common electrodes connected to said output signal current terminal, the output electrode of a first one of said plurality of further transistors connecting to the output connection of said current mirror amplifying means;
respective switch means selectively connecting the output electrode of an associated other one of said plurality of transistors of said second supply voltage terminal for conditioning its associated transistor to conduct to decrease the conduction of the first one of said plurality of transistors and thus decrement the current gain between said input signal current and said output signal current terminals; and respective further switch means selectively connecting the output electrode of an associated other one of said plurality of further transistors to said second supply voltage terminal for conditioning its associated further transistor to conduct to augment the conduction of said first one of said plurality of further transistors and thus increment the current gain between said input signal current and said output signal current terminals.

19. The circuitry of claim 18 wherein said current mirror amplifying means comprises:

input and output transistors of complementary conductivity to that of the transistors called for in claim 18, having respective input, output and common electrodes, their common electrodes connecting to said common connection, the output electrode of said input transistor connecting to said input connection, the output electrode of said output transistor connecting to said output connection, and their input electrodes connecting together at a node; and means completing a direct-coupled feedback connection for applying a potential responsive to the potential at said input connection to said node.

20. The circuitry of claim 19 wherein said means completing a direct-coupled feedback connection includes a direct connection of said input signal current terminal to said node.

21. The circuitry of claim 19 wherein said means completing a direct-coupled feedback connection includes a direct connection of said input connection to said node.

22. The circuitry of claim 18, 19, 20, or 21 wherein each said switch means and each said further switch means respectively include:

a switch transistor having first and second electrodes and a principal-conduction path therebetween, and having a control electrode to which its principal-conduction path is responsive, the principal-conduction path of said switch transistor connecting the output electrode of its associated transistor to said second supply voltage terminal; and means selectively applying a control signal to the control electrode of said switch transistor for rendering its principal-conduction path selectively conductive.

23. A programmable current amplifying circuit comprising:

input signal and output signal terminals;

a current mirror amplifier having input and common connections and an input circuit coupled therebetween for receiving an input current, and having at least one output connection and an output circuit coupled between said output and common connections, said output circuit for providing a current G times said input current, where G is a positive number;

means for connecting the input and common connections of said current mirror amplifier to said input signal and output signal terminals, respectively;

switch means responsive to a control signal for selectively connecting at least one said output connection of said current mirror amplifier to a source of operating potential; and means for selectively applying said control signal to said switch means.

24. The amplifying circuitry of claim 23 further comprising means connected between the respective ends of said input and output circuits remote from said common connection for maintaining the potential across said output circuit in the same polarity sense as that across said input circuit, with respect to said common connection, when said output connection is not connected to said source of operating potential by said switch means.

25. The amplifying circuitry of claim 23 wherein:

said input circuit of said current mirror amplifier includes a first transistor having output and common electrodes and a principal-conduction path therebetween, and having an input electrode to which its principal-conduction path is responsive, its output electrode connecting to the input connection of said current mirror amplifier and its common electrode connecting to the common connection thereof;

said output circuit of said current mirror amplifier includes a second transistor of like conductivity type to that of said first transistor, having output and common electrodes and a principal-conduction path therebetween, and having an input electrode to which its principal-conduction path is responsive, its output electrode connecting to the output connection of said current mirror amplifier and its common electrode connecting to the common connection thereof; and further including means for completing a direct-coupled feedback connection between the output electrode of said first transistor and the respective input electrodes of said first and second transistors to condition them for conduction.

26. The circuit of claim 25 further comprising a plurality of diode means having first and second electrodes, their respective first electrodes being connected to the output electrode of said first transistor, the second electrode of a first of said plurality of diodes being connected to the input electrode of said first transistor to serve as said means for completing a direct-coupled feedback connection, and the second electrode of a second of said plurality of diode means connecting to the output electrode of said second transistor and being poled to be reverse biased when that output electrode is connected to said source of operating potential by said switch means.

27. The circuit of claim 23, 24, 25 or 26 wherein:

said switch means includes a third transistor having first and second electrodes and a principal-conduction path therebetween, and having a control electrode to which its principal-conduction path is responsive, the principal-conduction path of said third transistor being in series connection with at least one said output circuit, and wherein said means for selectively applying said control signal applies said control signal to the control electrode of said third transistor for rendering its principal-conduction path selectively conductive.

* * * * *

UNITED STATES PATENT AND TRADEMARK OFFICE
CERTIFICATE OF CORRECTION

PATENT NO. : 4,361,816

DATED : November 30, 1982

INVENTOR(S) : Otto H. Schade, Jr.

It is certified that error appears in the above-identified patent and that said Letters Patent is hereby corrected as shown below:

| | |
|---|---|
| Column 1, line 39 | "are" should be --art--. |
| Column 5, line 43 | "is" should be --in--. |
| Column 7, line 38 | "CMS" should be --CMA--. |
| Column 12, line 68 | "of", second occurrence thereof, should be --to--. |

Signed and Sealed this

Fifteenth Day of March 1983

[SEAL]

Attest:

Attesting Officer

GERALD J. MOSSINGHOFF

Commissioner of Patents and Trademarks